(12) United States Patent
Nakamura et al.

(10) Patent No.: US 11,258,467 B2
(45) Date of Patent: Feb. 22, 2022

(54) FILTER, MULTIPLEXER, RADIO FREQUENCY FRONT-END CIRCUIT, AND COMMUNICATION DEVICE

(71) Applicant: Murata Manufacturing Co., Ltd., Nagaokakyo (JP)

(72) Inventors: Kentaro Nakamura, Nagaokakyo (JP); Noriyoshi Ota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/411,145

(22) Filed: Aug. 25, 2021

(65) Prior Publication Data

US 2021/0384924 A1    Dec. 9, 2021

Related U.S. Application Data

(63) Continuation of application No. PCT/JP2020/009637, filed on Mar. 6, 2020.

(30) Foreign Application Priority Data

Mar. 6, 2019  (JP) .............................. JP2019-040590

(51) Int. Cl.
  *H03H 9/64* (2006.01)
  *H03H 9/145* (2006.01)
  (Continued)

(52) U.S. Cl.
  CPC ......... *H04B 1/0057* (2013.01); *H03H 9/6483* (2013.01); *H03H 9/725* (2013.01)

(58) Field of Classification Search
  CPC .................................. H03H 9/64; H03H 9/725
  (Continued)

(56) References Cited

U.S. PATENT DOCUMENTS 9,252,732 B2 *   2/2016   Yamashita ............... H03H 3/08
2011/0215883 A1*  9/2011   Fujiwara .................. H03H 9/64
                                                  333/195

(Continued)

FOREIGN PATENT DOCUMENTS

CN    103051303 A    4/2013
CN    109417379 A    3/2019
(Continued)

OTHER PUBLICATIONS

Official Communication issued in International Patent Application No. PCT/JP2020/009637, dated May 26, 2020.
(Continued)

*Primary Examiner* — Tan H Trinh
(74) *Attorney, Agent, or Firm* — Keating & Bennett, LLP

(57) ABSTRACT

A filter includes series resonators in a signal path. An IDT electrode included in the series resonators includes at least either first electrode fingers including variant portions or second electrode fingers not including variant portions. In the IDT electrode included in one or more series resonators of the series resonators, a direction that connects the respective other ends of a plurality of electrode fingers intersects an acoustic wave propagation direction. In a first portion and a second portion of the IDT electrode, the first and second electrode fingers are arranged in a predetermined order.

19 Claims, 11 Drawing Sheets

(51) Int. Cl.
*H03H 9/02* (2006.01)
*H04B 1/00* (2006.01)
*H03H 9/72* (2006.01)

(58) Field of Classification Search
USPC ............... 455/339, 66.1, 67.13, 114.2, 222; 333/133, 195
See application file for complete search history.

(56) References Cited

U.S. PATENT DOCUMENTS

| | | | |
|---|---|---|---|
| 2013/0088308 A1 | 4/2013 | Tsuda | |
| 2013/0257562 A1* | 10/2013 | Schmidhammer | H03H 9/64 333/133 |
| 2016/0294361 A1* | 10/2016 | Yamane | H03H 9/14576 |
| 2018/0102755 A1* | 4/2018 | Takamine | H03H 9/13 |
| 2019/0123721 A1* | 4/2019 | Takamine | H03H 9/145 |
| 2019/0267968 A1* | 8/2019 | Hamatani | H03H 9/02559 |
| 2021/0021256 A1* | 1/2021 | Okada | H03H 9/725 |
| 2021/0328572 A1* | 10/2021 | Nakazawa | H03H 9/54 |

FOREIGN PATENT DOCUMENTS

| | | |
|---|---|---|
| JP | 2011-182220 A | 9/2011 |
| WO | 2015/098756 A1 | 7/2015 |
| WO | 2016/208236 A1 | 12/2016 |
| WO | 2018/003273 A1 | 1/2018 |

OTHER PUBLICATIONS

Official Communication issued in corresponding Chinese Patent Application No. 202080017435.0, dated Dec. 7, 2021.

* cited by examiner

FILTER, MULTIPLEXER, RADIO FREQUENCY FRONT-END CIRCUIT, AND COMMUNICATION DEVICE

CROSS REFERENCE TO RELATED APPLICATIONS

This application claims the benefit of priority to Japanese Patent Application No. 2019-040590 filed on Mar. 6, 2019 and is a Continuation Application of PCT Application No. PCT/JP2020/009637 filed on Mar. 6, 2020. The entire contents of each application are hereby incorporated herein by reference.

BACKGROUND OF THE INVENTION

1. Field of the Invention

The present invention relates to a filter, a multiplexer, a radio frequency front-end circuit, and a communication device.

2. Description of the Related Art

Conventionally, using an inclined IDT electrode portion has been known to suppress a transverse mode. The inclined IDT electrode portion is an IDT electrode portion where an electrode finger overlapping area is formed at an angle with respect to an acoustic wave propagation direction.

The inclined IDT electrode portion is particularly effective when used in an acoustic wave device which is formed by stacking a high-acoustic-velocity film, a low-acoustic-velocity film, a piezoelectric film, and an IDT electrode in this order on a supporting substrate. This is because although the acoustic wave device using such a multilayer substrate can enhance the Q-factor, a transverse mode ripple appears in the frequency characteristic.

In the inclined IDT electrode portion described above, a standing wave occurs in a gap located between an electrode finger and an opposite busbar or offset electrode finger, and this causes a ripple in the vicinity of the resonant frequency. Accordingly, a technique has been proposed in which an end of the electrode finger includes a variant portion protruding in the acoustic wave propagation direction to reduce a ripple in the vicinity of the resonant frequency (see, e.g., International Publication No. 2015/098756). In the present specification, an electrode finger including such a variant portion at an end thereof will be referred to as a variant finger.

In a resonator where electrode fingers in an inclined IDT electrode portion are variant fingers, a ripple in the vicinity of the resonant frequency can be reduced. However, the variant fingers cause a ripple in the vicinity of the anti-resonant frequency.

In a multiplexer including a plurality of filters, a ripple in the vicinity of the anti-resonant frequency of a resonator included in one filter may be located in the pass band of a different filter. In this case, a ripple occurring in the vicinity of the anti-resonant frequency of the resonator of the one filter may degrade a characteristic in the pass band of the different filter.

SUMMARY OF THE INVENTION

Preferred embodiments of the present invention provide filters that are each able to reduce both a ripple in the vicinity of the resonant frequency and a ripple in the vicinity of the anti-resonant frequency, and multiplexers, radio frequency front-end circuits, and communication devices each including such filters.

A filter according to a preferred embodiment of the present invention includes a pair of input and output terminals, and one or more series resonators along a signal path connecting the input and output terminals. The one or more series resonators each include an IDT electrode including a pair of comb-teeth electrodes on a substrate including a piezoelectric layer. Each of the comb-teeth electrodes included in each of the one or more series resonators includes a plurality of electrode fingers extending in a direction orthogonal or substantially orthogonal to an acoustic wave propagation direction, and a busbar electrode connecting respective first ends of the plurality of electrode fingers. The IDT electrode included in each of the one or more series resonators includes at least either first electrode fingers whose electrode finger width at second ends of the plurality of electrode fingers is greater than an electrode finger width at middle portions, or second electrode fingers whose electrode finger width at second ends is less than or equal to an electrode finger width at middle portions. The one or more series resonators include one or more first series resonators. In the IDT electrode of each of the one or more first series resonators, a direction connecting the respective second ends of the plurality of electrode fingers intersects the acoustic wave propagation direction. The IDT electrode of each of the one or more first series resonators includes a first portion and a second portion. In the IDT electrode, the first electrode fingers and the second electrode fingers are provided in a predetermined order in the first portion, and the first electrode fingers and the second electrode fingers are provided in the predetermined order in the second portion.

In each of the filters according to preferred embodiments of the present invention, in the IDT electrode of each first series resonator, the first electrode fingers (variant fingers) and the second electrode fingers (electrode fingers not including variant portions) are provided in a mixed manner. This enables reduction of both a ripple which tends to increase in the vicinity of an anti-resonant frequency when all of the electrode fingers are first electrode fingers, and a ripple which tends to increase in the vicinity of a resonant frequency when all of the electrode fingers are second electrode fingers. Filters are thus obtained, which are each able to reduce both a ripple in the vicinity of a resonant frequency and a ripple in the vicinity of an anti-resonant frequency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
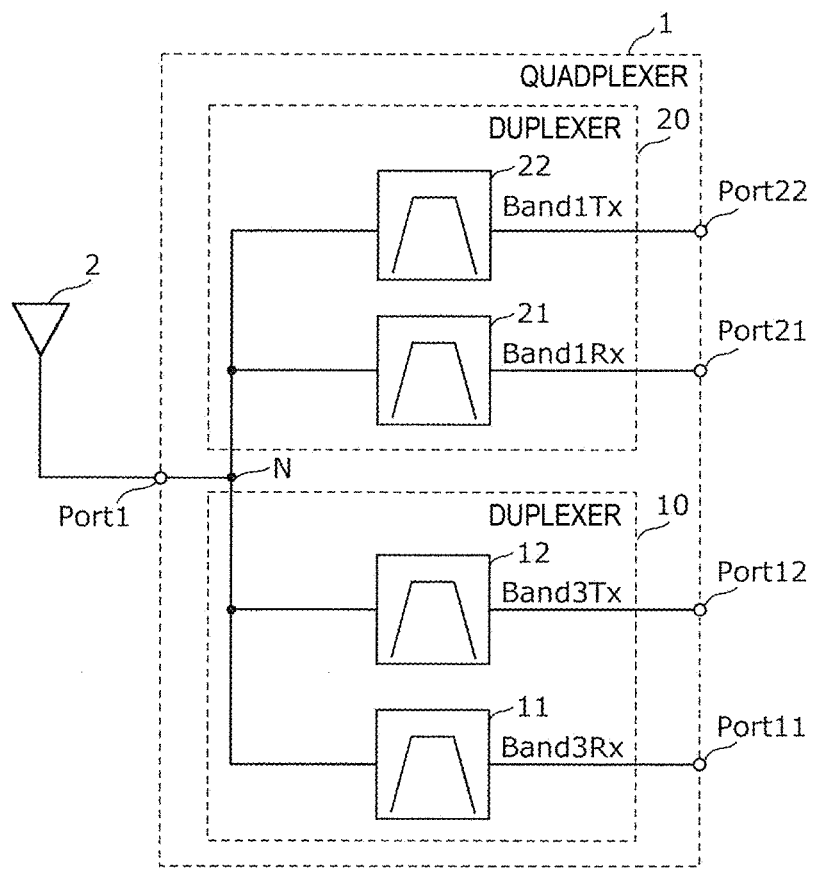
FIG. 1 is a diagram illustrating a quadplexer according to a first preferred embodiment of the present invention.

Preferred embodiments of the present invention will now be described in detail with reference to examples and the drawings. Note that all preferred embodiments to be described provide either comprehensive or specific examples. Numerical values, shapes, materials, components, and arrangements and structures of connection of the components presented in the following preferred embodiments are merely examples and are not intended to limit the scope of the present invention. Of the components in the preferred embodiments to be described, those not recited in the independent claims are explained as optional components. The sizes of the components illustrated in the drawings or the ratios of the sizes are not necessarily exact. Throughout the drawings, the same or substantially the same components are denoted by the same reference numerals and their overlapping descriptions may be omitted or simplified. In the following preferred embodiments, "being connected" refers not only to the case of being directly connected, but also to the case of being electrically connected, for example, through another element.

First Preferred Embodiment

In a first preferred embodiment of the present invention, a quadplexer will be described as an example of a multiplexer.

[1. Basic Configuration of Multiplexer

FIG. 1 is a diagram illustrating a configuration of a quadplexer 1 according to the present preferred embodiment. An antenna element 2 connected to a common terminal Port 1 of the quadplexer 1 is also illustrated in FIG. 1.

The quadplexer 1 is a multiplexer (branching filter) that includes a plurality of filters (four filters 11, 12, 21, and 22 here) with different pass bands. Terminals of the plurality of filters adjacent to the antenna are joined at the common terminal Port 1.

Specifically, as illustrated in FIG. 1, the quadplexer 1 includes the common terminal Port 1, four individual terminals Ports 11, 12, 21, and 22, and the four filters 11, 12, 21, and 22.

The common terminal Port 1 is common to the four filters 11, 12, 21, and 22 and is connected, inside the quadplexer 1, to the filters 11, 12, 21, and 22. At the same time, the common terminal Port 1 is connected, outside the quadplexer 1, to the antenna element 2. This means that the common terminal Port 1 also defines and functions as an antenna terminal for the quadplexer 1.

The individual terminals Ports 11, 12, 21, and 22 are individually provided for the four filters 11, 12, 21, and 22, respectively, and are each connected, inside the quadplexer 1, to the corresponding filter. At the same time, the individual terminals Ports 11, 12, 21, and 22 are connected, outside the quadplexer 1, to an RF signal processing circuit (radio frequency integrated circuit (RFIC), not shown), with for example an amplifying circuit (not shown) interposed therebetween.

The filter 11 is disposed in a path that connects the common terminal Port 1 to the individual terminal Port 11. In the present preferred embodiment, the filter 11 is, for example, a receiving filter that uses a downlink frequency band (reception band) in Band 3 of the Long-Term Evolution (LTE) as a pass band. In the present preferred embodiment, the filter 11 corresponds to a second filter disposed in a second path that connects the common terminal Port 1 to a second terminal (individual terminal Port 11 here).

The filter 12 is disposed in a path that connects the common terminal Port 1 to the individual terminal Port 12. In the present preferred embodiment, the filter 12 is, for example, a transmitting filter that uses an uplink frequency band (transmission band) in Band 3 of the LTE as a pass band. In the present preferred embodiment, the filter 12 corresponds to a first filter disposed in a first path that connects the common terminal Port 1 to a first terminal (individual terminal Port 12 here).

The filter 21 is disposed in a path that connects the common terminal Port 1 to the individual terminal Port 21. In the present preferred embodiment, the filter 21 is, for example, a receiving filter that uses a downlink frequency band (reception band) in Band 1 of the LTE as a pass band.

The filter 22 is disposed in a path that connects the common terminal Port 1 to the individual terminal Port 22. In the present preferred embodiment, the filter 22 is, for example, a transmitting filter that uses an uplink frequency band (transmission band) in Band 1 of the LTE as a pass band.

The filter 11 and the filter 12 define an unbalanced duplexer 10 that uses, for example, Band 3 of the LTE as a pass band. Similarly, the filter 21 and the filter 22 define an unbalanced duplexer 20 that uses, for example, Band 1 of the LTE as a pass band. That is, for example, the quadplexer 1 according to the present preferred embodiment has a configuration where the common terminal Port 1 defines and functions both as a common terminal (antenna terminal) for the duplexer 10 using Band 3 of the LTE as a pass band and a common terminal (antenna terminal) for the duplexer 20 using Band 1 of the LTE as a pass band. In the present preferred embodiment, a signal path passing through the duplexer 10 and a signal path passing through the duplexer 20 are connected at a node N. That is, the node N is a point where these two signal paths are joined.

Frequency bands allocated to Bands 1 and 3 of the LTE, which define and function as a pass band of the quadplexer 1 according to the present preferred embodiment, will now be described. For the range of a frequency band to be described, a numerical range of higher than or equal to A and lower than or equal to B will be simply referred to as "A to B".

Figure 2:
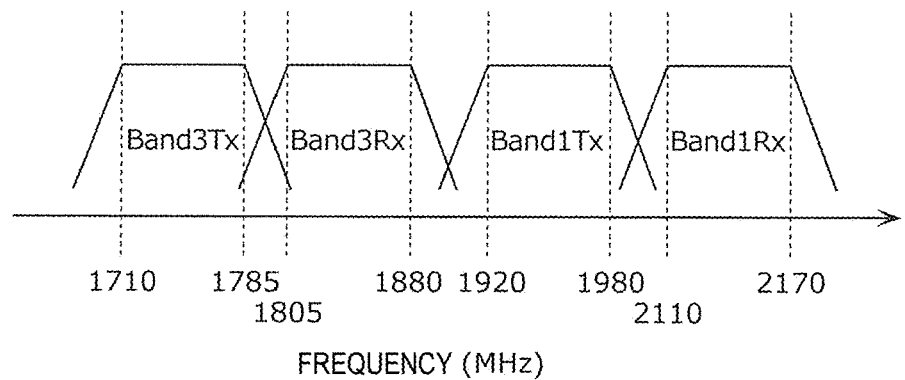
FIG. 2 is a diagram for explaining frequency bands allocated to Bands 1 and 3.

FIG. 2 is a diagram for explaining frequency bands allocated to Bands 1 and 3. Hereinafter, "Band of the LTE" may be simply described as "Band", and the reception band (Rx) and the transmission band (Tx) of each Band may be simply described by a combination of a band name and a term representing either the reception or transmission band and added to the end of the band name. For example, the reception band (Rx) of Band 1 may be described as "Band 1 Rx band".

As illustrated in FIG. 2, as for Band 1, about 1920 MHz to about 1980 MHz is allocated to the transmission band and about 2110 MHz to about 2170 MHz is allocated to the reception band. As for Band 3, about 1710 MHz to about 1785 MHz is allocated to the transmission band and about 1805 MHz to about 1880 MHz is allocated to the reception band. Accordingly, the filters 11, 12, 21, and 22 are required to have a filter characteristic that allows the transmission band or reception band of the corresponding Band to pass through and attenuates the other bands, as indicated by solid lines in FIG. 2.

As described above, the quadplexer 1 includes the filter 12 on the low frequency side (first filter) and the filter 11 on the high frequency side (second filter) having a pass band with frequencies higher than those for the filter 12. The quadplexer 1 includes the duplexer 10 that includes two filters including the filter 12 (filters 11 and 12 in the present preferred embodiment), and the duplexer 20 that includes two filters including the filter (filters 21 and 22 in the present preferred embodiment).

The pass bands of the two duplexers 10 and 20 do not necessarily need to be a combination of Bands 3 and 1 and may be, for example, a combination of Bands 25 and 66 or a combination of Bands 3 and 7. In the quadplexer 1, an impedance element, such as an inductor, to provide impedance matching may be connected, for example, in a path that connects each of the filters 11, 12, 21, and 22 to the node N or in a path that connects the node N to the common terminal Port 1.

2. Basic Configuration of Filter

A basic configuration of the filters 11, 12, 21, and 22 will now be described by referring to, as an example, the basic configuration of the filter 12 (first filter) that uses Band 3 Tx as a pass band.

Figure 3:
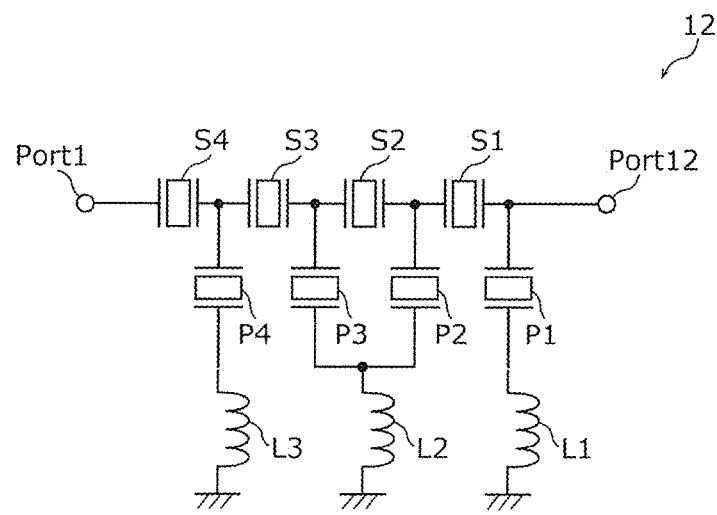
FIG. 3 is a diagram illustrating a circuit configuration of a filter according to the first preferred embodiment of the present invention.

FIG. 3 is a diagram illustrating a circuit configuration of the filter 12. As illustrated in FIG. 3, the filter 12 includes series resonators S1 to S4, parallel resonators P1 to P4, and inductors L1 to L3.

The series resonators S1 to S4 are connected in series in this order from the individual terminal Port 12, in a signal path (series arm) that connects the common terminal Port 1 to the individual terminal Port 12. The parallel resonators P1 to P4 are connected in parallel to each other and disposed in respective signal paths (parallel arms), each of which connects a point of connection of the individual terminal Port 12 and a corresponding one of the series resonators S1 to S4 to a reference terminal (ground). Specifically, the parallel resonator P1 is connected to the reference terminal, with the inductor L1 interposed therebetween, the parallel resonators P2 and P3 are connected to the reference terminal, with the inductor L2 interposed therebetween, and the parallel resonator P4 is connected to the reference terminal, with the inductor L3 interposed therebetween. With the connection configuration of the series resonators S1 to S4 and the parallel resonators P1 to P4 described above, the filter 12 defines a ladder band pass filter.

As described above, the filter 12 (first filter) has a ladder filter structure including two or more series resonators (for example, four series resonators S1 to S4 in the present preferred embodiment) disposed in a signal path, and one or more parallel resonators (for example, four parallel resonators P1 to P4 in the present preferred embodiment) each disposed in a path that connects the signal path to a reference terminal (ground).

The numbers of series and parallel resonators of the filter 12 are not limited to four. It is only necessary that the filter 12 include two or more series resonators and one or more parallel resonators.

The parallel resonators P1 to P4 may each be directly connected to the reference terminal, without a corresponding one of the inductors L1 to L3 interposed therebetween. The series arm or parallel arm may include an impedance element, such as an inductor or capacitor, inserted therein or connected thereto.

Referring to FIG. 3, the reference terminal (ground) to which both the parallel resonators P2 and P3 are connected is a common reference terminal, and the reference terminal to which the parallel resonator P1 is connected and the reference terminal to which the parallel resonator P4 is connected are individual reference terminals. However, the configuration is not limited to this, and common or individual reference terminals may be appropriately selected depending on, for example, constraints on the mounting layout of the filter 12.

A parallel resonator may be connected to a node of the series resonator S4 adjacent to the common terminal Port 1. Of the series resonators S1 to S4 of the ladder filter structure, the series resonator S4 is preferably closest to the common terminal Port 1. The parallel resonator P1 connected to the node of the series resonator S1 adjacent to the individual terminal Port 12 may be removed. The series resonator S1 is preferably closest to the individual terminal Port 12.

3. Basic Structure of Resonator

A basic structure of the resonators (series resonators and parallel resonators) included in the filter 12 (first filter) will now be described. In the present preferred embodiment, the resonators are, for example, surface acoustic wave (SAW) resonators.

Note that the other filters 11, 21, and 22 do not necessarily need to be configured as described above and may be designed appropriately, for example, in accordance with required filter characteristics. Specifically, the filters 11, 21, and 22 do not necessarily need to have a ladder filter structure and may have, for example, a longitudinally coupled filter structure. Also, the resonators included in the filters 11, 21, and 22 do not necessarily need to be SAW resonators and may be, for example, bulk acoustic wave (BAW) resonators. The filters 11, 21, and 22 may be configured without using acoustic wave resonators and may be, for example, LC resonant filters or dielectric filters.

Figure 4:
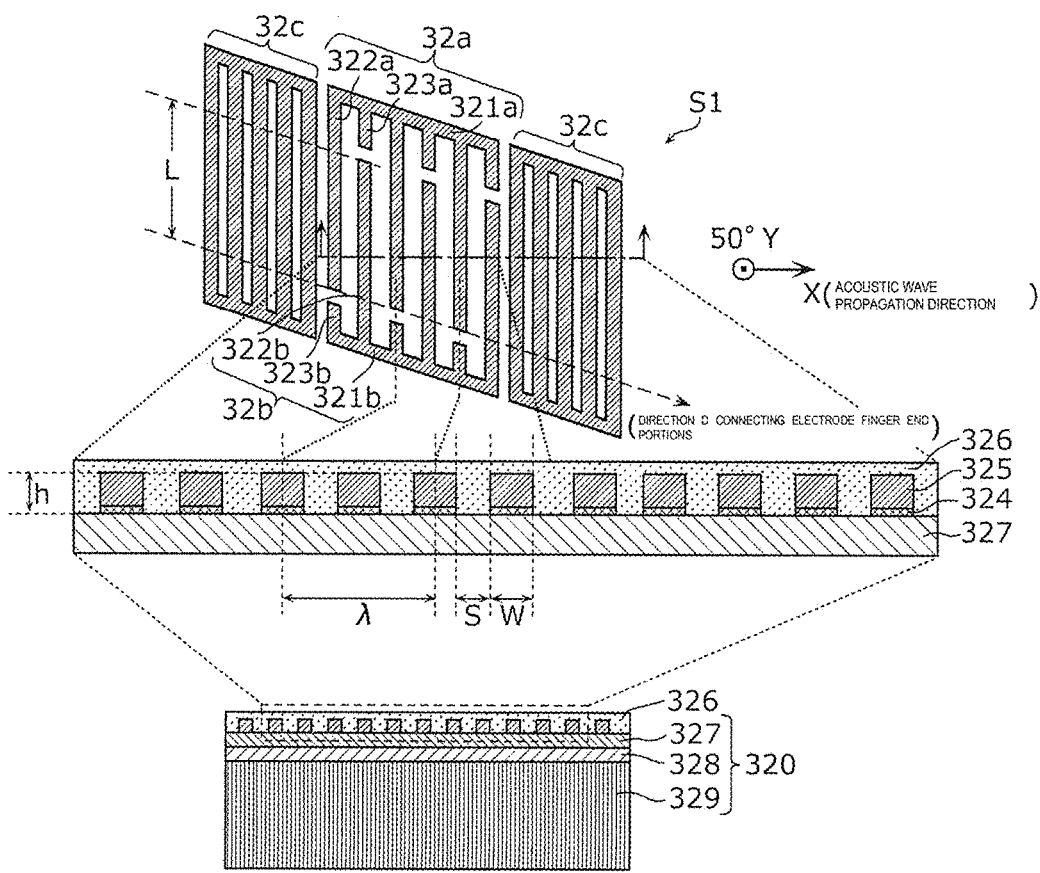
FIG. 4 presents a plan view and a cross-sectional view schematically illustrating a resonator according to the first preferred embodiment of the present invention.

FIG. 4 includes a plan view and a cross-sectional view schematically illustrating a resonator of the filter 12 according to the present preferred embodiment. The schematic plan view and the schematic cross-sectional view of FIG. 4 illustrate the structure of the series resonator S1 that defines and functions as a representative example of the plurality of resonators included in the filter 12. The series resonator S1 in FIG. 4 is provided to explain a typical structure of the plurality of resonators described above, and the number and length of electrode fingers of an electrode are not limited to those illustrated. Although not shown in FIG. 4, the electrode fingers may be variant fingers including variant portions at ends thereof.

As illustrated in the plan view in FIG. 4, the series resonator S1 includes a pair of comb-teeth electrodes 32a and 32b opposite to each other and reflectors 32c disposed with respect to the pair of comb-teeth electrodes 32a and 32b in the acoustic wave propagation direction. The pair of comb-teeth electrodes 32a and 32b define an interdigital transducer (IDT) electrode. One of the reflectors 32c in a pair may be removed depending on, for example, constraints on the mounting layout.

The comb-teeth electrode 32a has a comb teeth shape and includes a plurality of electrode fingers 322a and a plurality of offset electrode fingers 323a that are parallel or substantially parallel to each other, and a busbar electrode 321a that connects respective one ends of the plurality of electrode fingers 322a and respective one ends of the plurality of offset electrode fingers 323a. Similarly, the comb-teeth electrode 32b has a comb teeth shape and includes a plurality of electrode fingers 322b and a plurality of offset electrode fingers 323b that are parallel or substantially parallel to each other, and a busbar electrode 321b that connects respective one ends of the plurality of electrode fingers 322b and respective one ends of the plurality of offset electrode fingers 323b. The plurality of electrode fingers 322a and 322b and the plurality of offset electrode fingers 323a and 323b extend in an orthogonal direction orthogonal or substantially orthogonal to the acoustic wave propagation direction (X-axis direction). The electrode fingers 322a and the offset electrode fingers 323b face each other in the orthogonal direction, and the electrode fingers 322b and the offset electrode fingers 323a face each other in the orthogonal direction.

A direction D that connects the respective other ends of the plurality of electrode fingers 322a (i.e., respective end portions of the plurality of electrode fingers 322a not connected to the busbar electrode 321a) intersects the acoustic wave propagation direction (X-axis direction) at a predetermined angle. Similarly, the direction D that connects the respective other ends of the plurality of electrode fingers 322b (i.e., respective end portions of the plurality of electrode fingers 322b not connected to the busbar electrode 321b) intersects the acoustic wave propagation direction (X-axis direction) at the predetermined angle. This shape enables each IDT electrode of the series resonators S1 to S4 and the parallel resonators P1 to P4 to define an inclined IDT where the acoustic wave propagation direction intersects the direction in which the plurality of electrode fingers are arranged.

In a one-port resonator including a surface acoustic wave and including a piezoelectric layer, the occurrence of a transverse mode ripple between the resonant frequency and the anti-resonant frequency may degrade a transmission characteristic in the pass band. To avoid this, the filter 12 according to the present preferred embodiment includes an inclined IDT as the IDT electrode of each resonator.

The reflectors 32c are arranged in the direction D with respect to the pair of comb-teeth electrodes 32a and 32b. Specifically, the reflectors 32c are arranged, with the pair of comb-teeth electrodes 32a and 32b interposed therebetween, in the direction D. The reflectors 32c each include a plurality of reflector electrode fingers that are parallel or substantially parallel to each other, and reflector busbar electrodes connecting the plurality of reflector electrode fingers. The reflector busbar electrodes of the pair of reflectors 32c are formed along the direction D.

The pair of reflectors 32c configured as described above can confine a standing wave of propagating acoustic waves within a resonator (series resonator S1 here) without leakage to the outside. This enables the resonator to allow low-loss propagation of a radio frequency signal in a pass band, which is defined for example by the electrode pitch, the number of pairs, and the overlapping width of the pair of comb-teeth electrodes 32a and 32b, and to significantly attenuate a radio frequency signal outside the pass band.

The IDT electrode including the plurality of electrode fingers 322a and 322b, the plurality of offset electrode fingers 323a and 323b, and the busbar electrodes 321a and 321b has, as illustrated in the cross-sectional view in FIG. 4, a multilayer structure of an adhesion layer 324 and a main electrode layer 325. The cross-sectional structure of the reflectors 32c is the same as the cross-sectional structure of the IDT electrode, and thus will not be described.

The adhesion layer 324 is a layer for improved adhesion between a piezoelectric layer 327 and the main electrode layer 325. For example, Ti is used as a material for the adhesion layer 324. The adhesion layer 324 has a film thickness of, for example, 12 nm.

As a material for the main electrode layer 325, for example, Al including about 1% Cu is used. The main electrode layer 325 has a film thickness of, for example, about 162 nm.

The protective layer 326 covers the IDT electrode. The protective layer 326 is designed, for example, to protect the main electrode layer 325 from the external environment, adjust the frequency temperature characteristic, and improve resistance to moisture. The protective layer 326 is a film primarily made of, for example, silicon dioxide. The protective layer 326 has a film thickness of, for example, about 25 nm.

The materials used for the adhesion layer 324, the main electrode layer 325, and the protective layer 326 are not limited to those described above. Also, the IDT electrode does not necessarily need to have the multilayer structure described above. For example, the IDT electrode may be made of a metal, such as Ti, Al, Cu, Pt, Au, Ag, or Pd, or an alloy of some of these metals. Also, the IDT electrode may include a plurality of multilayer bodies made of the metal or alloy described above. The protective layer 326 is optional.

The IDT electrode and the reflectors 32c described above are disposed on a principal surface of a substrate 320 described below. A multilayer structure of the substrate 320 will now be described.

As illustrated in the lower portion of FIG. 4, the substrate 320 includes a high-acoustic-velocity supporting substrate 329, a low-acoustic-velocity film 328, and a piezoelectric layer 327. The substrate 320 has a multilayer structure of the high-acoustic-velocity supporting substrate 329, the low-acoustic-velocity film 328, and the piezoelectric layer 327 stacked in this order.

The piezoelectric layer 327 is a piezoelectric film with the IDT electrode and the reflectors 32c disposed on a principal surface thereof. The piezoelectric layer 327 is made of, for example, a 50° Y-cut X-propagation LiTaO$_3$ piezoelectric single crystal or piezoelectric ceramic (i.e., a lithium tantalate single crystal cut by a plane containing, as a normal line, an axis rotated about 50° from the Y-axis about the X-axis serving as the central axis, or ceramic; the single crystal or ceramic where a surface acoustic wave propagates in the X-axis direction). The piezoelectric layer 327 has a thickness of, for example, about 3.5X or less, where X is the wavelength of an acoustic wave determined by the electrode pitch of the IDT electrode. For example, the piezoelectric layer 327 has a thickness of about 600 nm.

The high-acoustic-velocity supporting substrate 329 supports the low-acoustic-velocity film 328, the piezoelectric layer 327, and the IDT electrode. The high-acoustic-velocity supporting substrate 329 is a substrate in which a bulk wave propagates at an acoustic velocity higher than that of a surface or boundary acoustic wave propagating in the piezoelectric layer 327. The high-acoustic-velocity supporting substrate 329 confines a surface acoustic wave to a portion where the piezoelectric layer 327 and the low-acoustic-velocity film 328 are stacked, so as to prevent the surface acoustic wave from leaking below the high-acoustic-velocity supporting substrate 329. The high-acoustic-velocity supporting substrate 329 is, for example, a silicon substrate and is, for example, about 125 μm thick. The high-acoustic-velocity supporting substrate 329 may be made of, for example, any of (1) silicon carbide, silicon, or a piezoelectric material, such as lithium tantalate, lithium niobate, or crystal; (2) various types of ceramic, such as alumina, sapphire, zirconia, cordierite, mullite, steatite, or forsterite; (3) magnesia or diamond; (4) a material primarily made of any one of the materials described above; and (5) a material primarily made of a mixture of some materials described above.

The low-acoustic-velocity film 328 is a film in which a bulk wave propagates at an acoustic velocity lower than that of an bulk wave propagating in the piezoelectric layer 327. The low-acoustic-velocity film 328 is disposed between the piezoelectric layer 327 and the high-acoustic-velocity supporting substrate 329. With this structure and the property that the energy of an acoustic wave concentrates in an essentially low-acoustic-velocity medium, the energy of a surface acoustic wave is prevented from leaking to the outside of the IDT electrode. The low-acoustic-velocity film 328 is a film primarily made of, for example, silicon dioxide. The low-acoustic-velocity film 328 has a thickness of, for example, about 2X or less, where X is the wavelength of an acoustic wave determined by the electrode pitch of the IDT electrode. For example, the low-acoustic-velocity film 328 has a thickness of about 670 nm.

With the multilayer structure of the substrate 320 described above, the Q-factor at the resonant frequency and the anti-resonant frequency can be much higher than that with a conventional single-layer structure including only a piezoelectric substrate. That is, since a surface acoustic wave resonator with a high Q-factor can be provided, a filter with low insertion loss can be produced using this surface acoustic wave resonator.

The high-acoustic-velocity supporting substrate 329 may have a multilayer structure that includes a supporting substrate and a high-acoustic-velocity film in which a bulk wave propagates at an acoustic velocity higher than that of a surface or boundary acoustic wave propagating in the piezoelectric layer 327. In this case, the supporting substrate may be, for example, a piezoelectric substrate made of lithium tantalate, lithium niobate, or crystal; a ceramic substrate made of alumina, magnesia, silicon nitride, aluminum nitride, silicon carbide, zirconia, cordierite, mullite, steatite, or forsterite; a dielectric substrate made of glass or sapphire; a semiconductor substrate made of silicon or gallium nitride; or a resin substrate. The high-acoustic-velocity film may be made of any of various high-acoustic-velocity materials, such as, for example, aluminum nitride, aluminum oxide, silicon carbide, silicon nitride, silicon oxynitride, DLC, and diamond; a medium primarily made of any one of the materials described above; or a medium primarily made of a mixture of some materials described above.

In the present preferred embodiment, the IDT electrode included in the filter 12 is provided on the substrate 320 including the piezoelectric layer 327. Alternatively, the substrate on which the IDT electrode is provided may be a single-layer piezoelectric substrate including only the piezoelectric layer 327. The piezoelectric substrate in this case may be made of, for example, a piezoelectric single crystal of LiTaO$_3$ or another piezoelectric single crystal of LiNbO$_3$.

The substrate on which the IDT electrode included in the filter 12 is to be provided may have any structure that includes a piezoelectric layer. That is, the substrate may be entirely defined by a piezoelectric layer, or may have a multilayer structure including a supporting substrate and a piezoelectric layer thereon.

Although the piezoelectric layer 327 according to the present preferred embodiment uses, for example, a 50° Y-cut X-propagation LiTaO$_3$ single crystal, the cut-angle of the single crystal material is not limited to this. That is, the multilayer structure, material, and thickness may be changed as appropriate in accordance with, for example, the required bandpass characteristic of the acoustic wave filter device. A surface acoustic wave filter using a LiTaO$_3$ piezoelectric substrate or LiNbO$_3$ piezoelectric substrate having a cut-angle different from that described above can achieve an advantageous effect similar to that described above.

The electrode parameters of the IDT electrode included in the surface acoustic wave resonator will now be described.

The wavelength of the surface acoustic wave resonator is defined by a wavelength λ, which is the repetition period of the plurality of electrode fingers 322a or 322b of the IDT electrode illustrated in the middle portion of FIG. 4. The electrode pitch is half the wavelength λ and is defined by (W+S), where W is the line width of the electrode fingers 322a and 322b of the comb-teeth electrodes 32a and 32b and S is the space width between adjacent ones of the electrode fingers 322a and 322b. As illustrated in the upper portion of FIG. 4, an overlapping width L of the pair of the comb-teeth electrodes 32a and 32b is an electrode finger length along which the electrode fingers 322a and 322b overlap as viewed in the direction D. The electrode duty of each resonator is the occupancy of the line width of the plurality of electrode fingers 322a and 322b. That is, the electrode duty described above is the ratio of the line width of the plurality of electrode fingers 322a and 322b to the sum of the line width and the space width, expressed as W/(W+S).

Although the series resonator S1 includes an inclined IDT in the example described above, the configuration is not limited to this. Every series resonator and every parallel resonator may include an inclined IDT, or only the series resonators may each include an inclined IDT.

Although the series resonator S1 includes offset electrode fingers in the example described above, the configuration is not limited to this. Every series resonator and every parallel resonator may include offset electrode fingers, or some of the resonators may not include offset electrode fingers.

4. Resonator Structure in Filter according to Reference Examples

As described above, a resonator including an inclined IDT electrode portion has a ripple in the vicinity of the resonant frequency. If a resonator including an inclined IDT electrode portion includes variant fingers as electrode fingers, a ripple in the vicinity of the resonant frequency can be reduced. However, a ripple tends to occur in the vicinity of the anti-resonant frequency in this case.

Accordingly, for each of the series resonators S1 to S4 of the filter 12 illustrated in FIG. 3, Reference Examples 1 to 4 were provided to compare characteristics. In Reference Examples 1 to 4, either all or none of the electrode fingers including offset electrode fingers are variant fingers.

Figure 5:
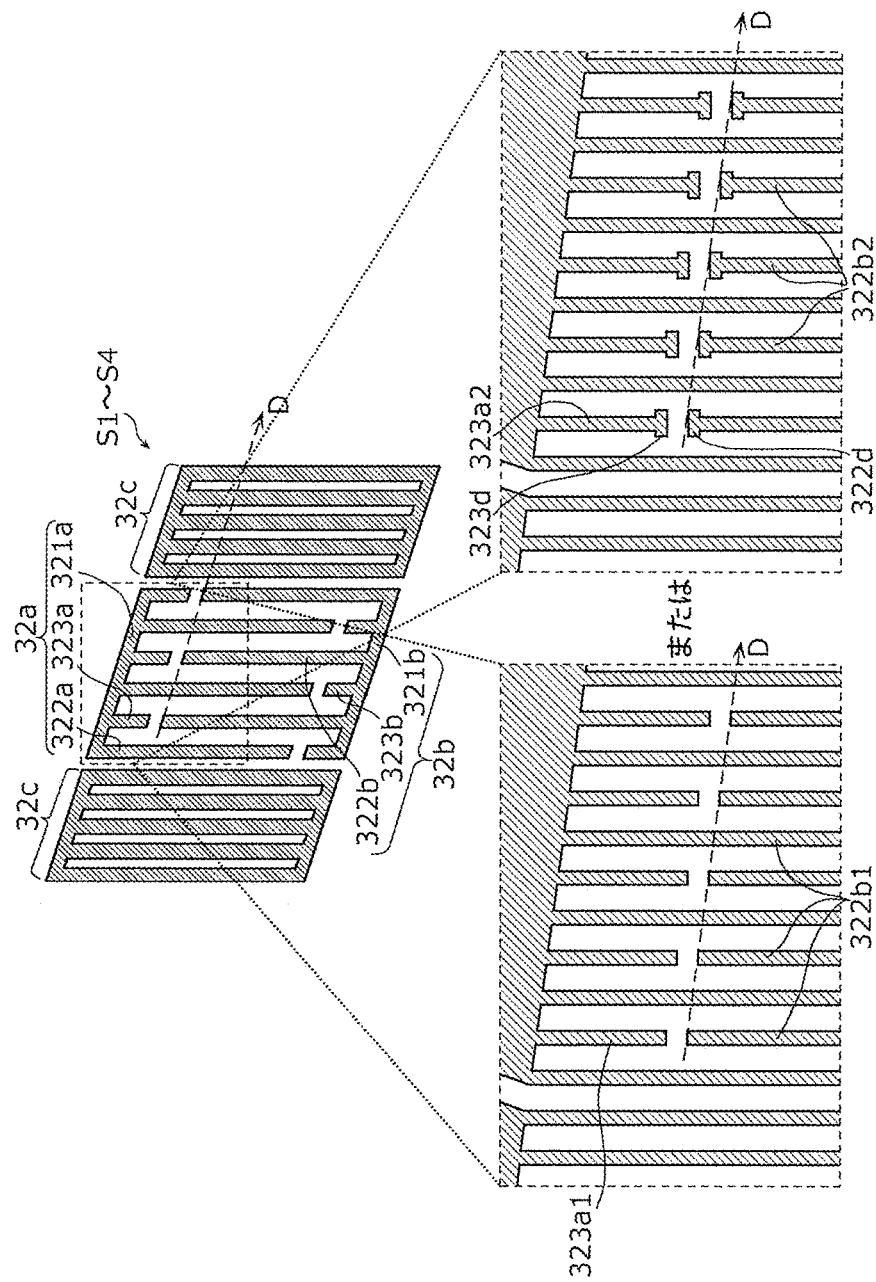
FIGS. 5A and 5B are plan views illustrating an IDT electrode of series resonators in a filter according to Reference Examples.

FIGS. 5A and 5B are plan views illustrating an IDT electrode of the series resonators S1 to S4 in the filter 12 according to Reference Examples 1 to 4.

In the filter 12 according to Reference Examples 1 to 4, in each of the series resonators S1 to S4, none of the electrode fingers 322a and 322b and offset electrode fingers 323a and 323b are variant fingers (see FIG. 5A) or all of them are variant fingers (see FIG. 5B). Here, the variant fingers are electrode fingers configured such that end portions thereof not connected to the busbar electrode are wider in electrode finger width than middle portions thereof (i.e., electrode fingers including variant portions).

As illustrated in FIG. 5A, in a resonator where none of electrode fingers are variant fingers, offset electrode fingers 323a1 and electrode fingers 322b1 are all second electrode fingers whose electrode finger width at end portions thereof is less than or equal to that at middle portions thereof. In this resonator, all of the electrode fingers 322a and the offset electrode fingers 323b are also second electrode fingers (not shown).

On the other hand, as illustrated in FIG. 5B, in a resonator where all electrode fingers are variant fingers, offset electrode fingers 323a2 and electrode fingers 322b2 are all first electrode fingers whose electrode finger width at end portions thereof is greater than that at middle portions thereof. That is, the offset electrode fingers 323a2 each include a variant portion 323d, and the electrode fingers 322b2 each include a variant portion 322d. In this resonator, all of the electrode fingers 322a and the offset electrode fingers 323b are also first electrode fingers (not shown).

Table 1 shows how, in Reference Examples 1 to 4, the resonators where all electrode fingers (including offset electrode fingers) are variant fingers are provided. In the following description, the shape of electrode fingers (including offset electrode fingers) not including variant portions will be expressed by such a phrase as "with variant portions removed". Such a phrase is only used to distinguish between the shape of electrode fingers not including variant portions and the shape of variant fingers, and does not limit the manufacturing procedure. That is, electrode fingers with variant portions removed may be ones that are formed by patterning into the shape that originally has no variant portions, for example.

For Reference Examples 1 to 4, Table 1 shows the percentage of variant portions removed in each resonator. Referring to Table 1, "0% of variant portions are removed" means that all electrode fingers (including offset electrode fingers) of the resonator are variant fingers, whereas "100% of variant portions are removed" means that none of electrode fingers (including offset electrode fingers) of the resonator have variant portions.

TABLE 1

| Percentage of Variant Portions Removed | Resonator S4 | Resonator S3 | Resonator S2 | Resonator S1 |
|---|---|---|---|---|
| Reference Example 1 | 0% | 0% | 0% | 0% |
| Reference Example 2 | 0% | 100% | 0% | 0% |
| Reference Example 3 | 100% | 100% | 100% | 100% |
| Reference Example 4 | 0% | 100% | 0% | 100% |

5. Comparison of Characteristics of Quadplexers Including Filters According to Reference Examples A bandpass characteristic and an isolation characteristic in the quadplexer 1 that includes, as the filter 12, one of filters according to Reference Examples 1 to 4 (hereinafter simply referred to as Reference Examples 1 to 4) will now be described.

First, Reference Example 1 will be described.

Figure 6:
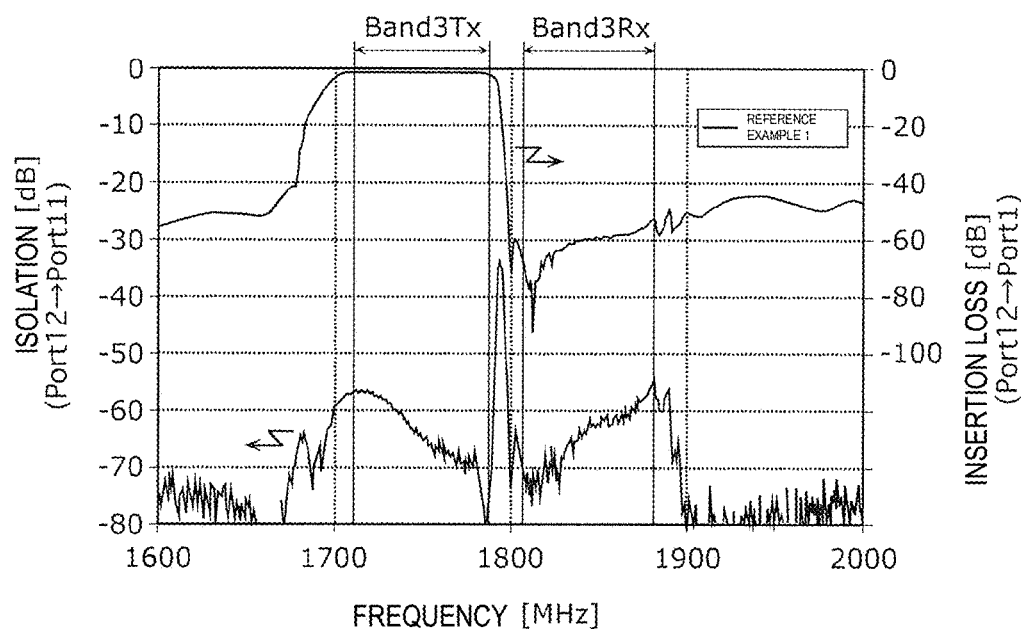
FIG. 6 is a graph showing a bandpass characteristic and an isolation characteristic of a quadplexer using a filter according to Reference Examples.

FIG. 6 is a graph showing an example of a bandpass characteristic between the individual terminal Port 12 and the common terminal Port 1 and an isolation characteristic between the individual terminal Port 12 and the individual terminal Port 11 in Reference Example 1.

Specifically, FIG. 6 shows the bandpass characteristic of a path passing through the filter 12 (filter for Band 3 Tx) and the isolation characteristic of a path passing through the filter 12 and the filter 11 (filter for Band 3 Rx). More specifically, FIG. 6 shows insertion loss which is the ratio of the strength of a signal output from the common terminal Port 1 to the strength of a signal input to the individual terminal Port 12, and also shows isolation which is the ratio of the strength of a signal output from the individual terminal Port 11 to the strength of a signal input to the individual terminal Port 12.

In both of the bandpass characteristic and the isolation characteristic shown in FIG. 6, a ripple appears at the high end of the reception band in Band 3 (Band 3 Rx). The ripple is found to be caused by the filter 12, because it occurs at the same frequency as a ripple (not shown) that occurs in the vicinity of the anti-resonant frequency in the characteristic of only the filter 12 of Reference Example 1.

As described above, if the quadplexer 1 includes the filter 12 where all electrode fingers (including offset electrode fingers) of all resonators are variant fingers, a characteristic in the pass band of another filter (e.g., filter 11) may be adversely affected.

Figure 7A:
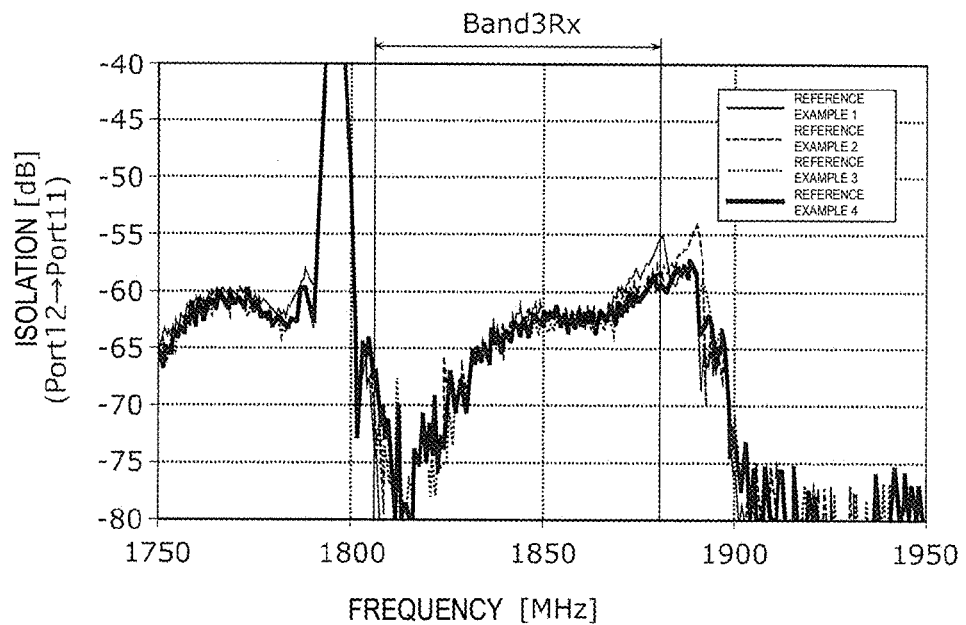
FIG. 7A is a graph showing a magnified view of the isolation characteristic of the quadplexer using the filter according to Reference Examples.

FIG. 7A is a graph showing a magnified view of an exemplary isolation characteristic between the individual terminal Port 12 and the individual terminal Port 11 in Reference Examples 1 to 4.

Figure 7B:
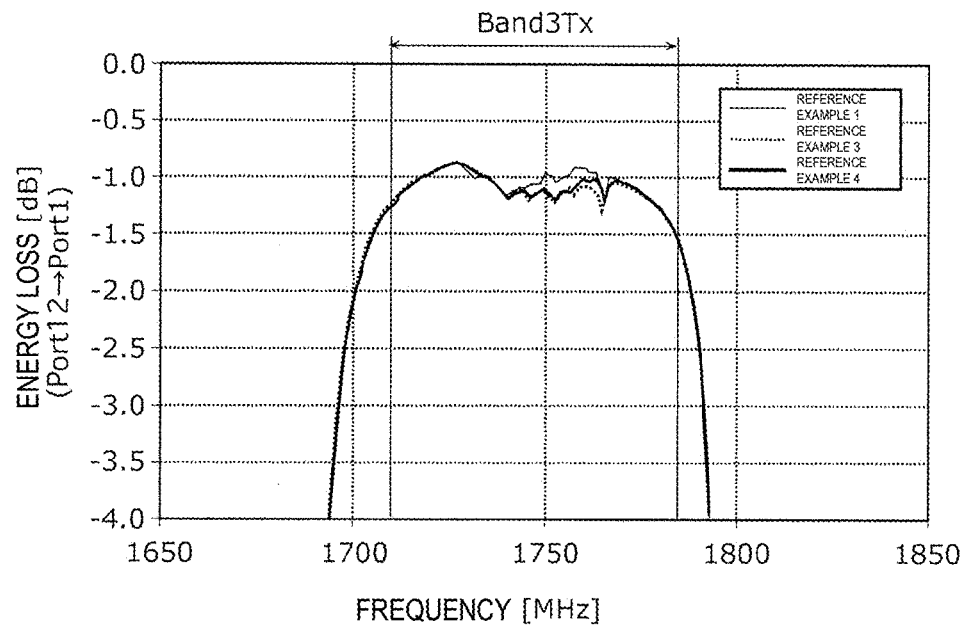
FIG. 7B is a graph showing a magnified view of energy loss in the quadplexer using the filter according to Reference Examples.

FIG. 7B is a graph showing a magnified view of an exemplary energy loss between the individual terminal Port 12 and the common terminal Port 1 in Reference Examples 1, 3, and 4. Here, the term "energy loss" refers to power consumption in a path obtained by subtracting matching loss from passing loss.

In Reference Example 3, unlike in Reference Example 1, the variant portions of all electrode fingers (including offset electrode fingers) of all resonators in the filter 12 are removed. In Reference Example 3, a ripple occurring in the isolation characteristic at the high end of Band 3 Rx is small, but an energy loss in Band 3 Tx is significant.

In the filter 12 of Reference Example 2, the variant portions of all electrode fingers (including offset electrode fingers) of the series resonator S3 are removed, whereas all electrode fingers (including offset electrode fingers) of the series resonators S1, S2, and S4 include variant portions. In Reference Example 2, the same level of ripple as that in Reference Example 1 occurs in the isolation characteristic at the high end of Band 3 Rx.

In the filter 12 of Reference Example 4, the variant portions of all electrode fingers (including offset electrode fingers) of the series resonators S1 and S3 are removed, whereas all electrode fingers (including offset electrode fingers) of the series resonators S2 and S4 include variant portions. In Reference Example 4, a ripple that occurs in the isolation characteristic at the high end of Band 3 Rx is as small as that in Reference Example 3, but an energy loss in Band 3 Tx is more significant than that in Reference Example 1.

As described above, Reference Example 2 where 100% of the variant portions are removed in only one series resonator (series resonator S3 here) cannot solve the problem in Reference Example 1, and Reference Example 4 where 100% of the variant portions are removed in two series resonators (series resonators S1 and S3 here) causes the same problem as that in Reference Example 3.

That is, as long as the percentage of variant portions removed is set to either 0% (not removed at all) or 100% (all removed) for each resonator, good characteristics cannot be achieved in terms of both a loss in the pass band and a ripple in the vicinity of the anti-resonant frequency.

6. Configurations of Filters According to Examples

Accordingly, the inventors of preferred embodiments of the present invention studied the configurations where the percentages of variant portions removed in the series resonators S1 and S3 are intermediate values greater than 0% and less than 100% (i.e., some of the variant portions are removed), whereas the percentages of variant portions removed in the series resonators S2 and S4 are 0% (i.e., none of the variant portions are removed). Specifically, a filter where 50% of the variant portions are removed in both the series resonators S1 and S3 and a filter where about 75% of the variant portions are removed in both the series resonators S1 and S3 were set as Example 1 and Example 2, respectively.

In Examples 1 and 2, the series resonators S2 and S4 are examples of a second series resonator including first electrode fingers including variant portions, whereas the series resonators S1 and S3 are examples of a first series resonator including first electrode fingers having variant portions and second electrode fingers not including variant portions.

In Examples 1 and 2, for simplicity, the second series resonators (series resonators S2 and S4) each include only first electrode fingers (i.e., 0% removed). However, the configuration is not limited to this and the second series resonator may include, for example, several second electrode fingers.

Figure 8A:
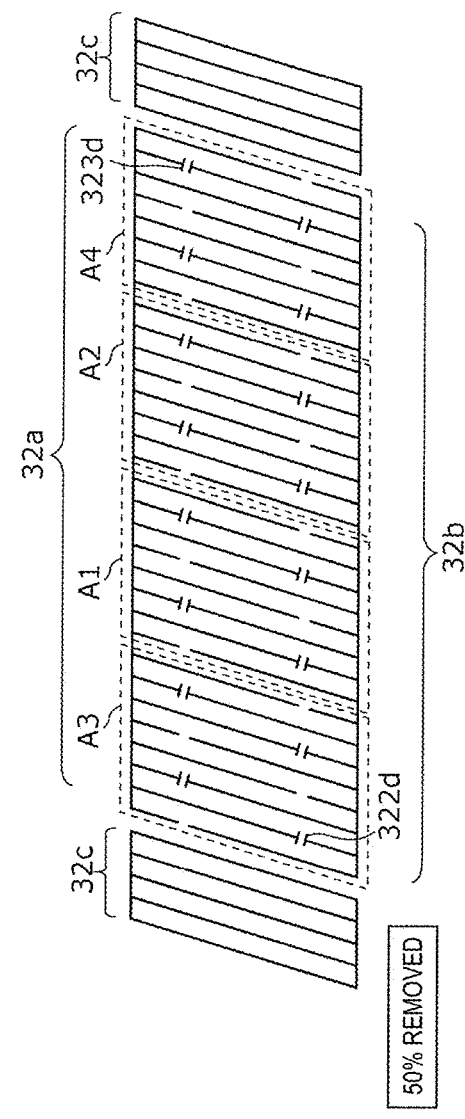
FIG. 8A is a plan view illustrating an exemplary arrangement of first electrode fingers and second electrode fingers in an IDT electrode of a filter according to an Example of a preferred embodiment of the present invention.
Figure 8B:
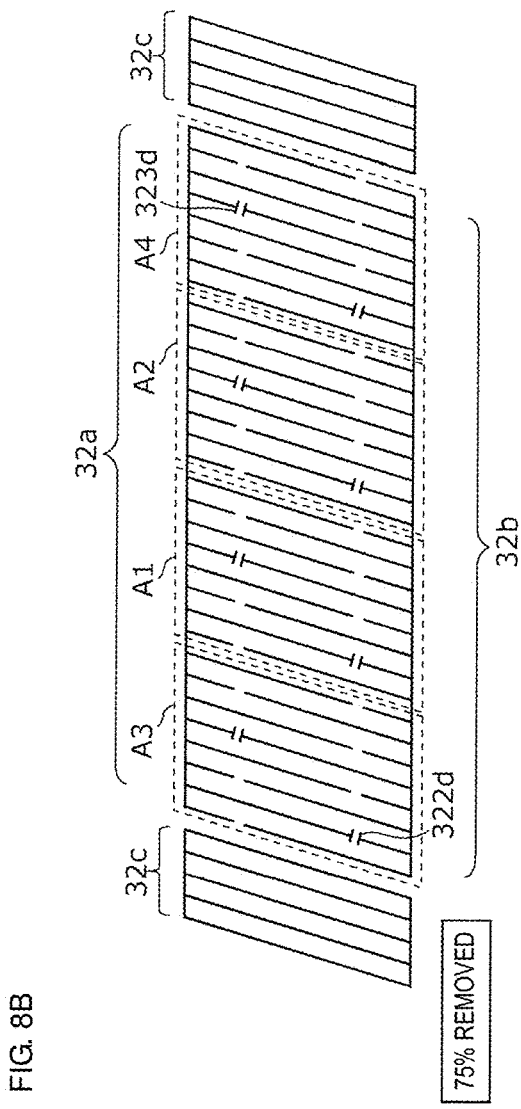
FIG. 8B is a plan view illustrating another exemplary arrangement of the first electrode fingers and the second electrode fingers in the IDT electrode of the filter according to an Example of a preferred embodiment of the present invention.

FIGS. 8A and 8B are plan views illustrating exemplary IDT electrodes of the first series resonators (series resonators S1 and S3) in the filter 12 according to Examples 1 and 2. FIGS. 8A and 8B simplify the configuration of the entire comb-teeth electrodes 32a and 32b illustrated in FIGS. 5A and 5B. FIG. 8A illustrates an example of how the variant portions 322d and 323d are arranged when 50% of the variant portions are removed, and FIG. 8B illustrates an example of how the variant portions 322d and 323d are arranged when 75% of the variant portions are removed. Here, the percentage of variant portions removed refers to the ratio of electrode fingers and offset electrode fingers not including variant portions to all electrode fingers and offset electrode fingers of an IDT electrode.

In FIG. 8A, where the variant portion of one in every two electrode fingers is removed, the percentage of removal is 50%. In FIG. 8B, where the variant portions of three in every four electrode fingers are removed, the percentage of removal is 75%.

In the examples illustrated in both of FIGS. 8A and 8B, the variant portions are periodically removed. Here, the phrase "variant portions are periodically removed" means that in a first portion and a second portion of the IDT electrode, first electrode fingers including the variant portions 322d and 323d and second electrode fingers not including the variant portions 322d and 323d are arranged in the same predetermined order. In the example of FIG. 8A, a set of two first electrode fingers, a set of two second electrode fingers, and a set of two first electrode fingers are alternately arranged in this order. In the example of FIG. 8B, one first electrode finger, a set of two second electrode fingers, and one first electrode finger are alternately arranged in this order. Either one or a group of first electrode fingers, and either one or a group of second electrode fingers, may be alternately arranged. It is only necessary that in the first and second portions, the first electrode finger (group) and the second electrode finger (group) are alternately arranged at least once.

In the examples of FIGS. 8A and 8B, in all portions A1 to A4 into which the entire IDT electrode is divided in the acoustic wave propagation direction, the first and second electrode fingers are arranged in a predetermined order. In these examples, two of the portions A1 to A4 are examples of the first and second portions of the IDT electrode. For example, when the portions A1 and A2 are considered as the first portion and the second portion of the IDT electrode, the first portion (part A1) and the second portion (part A2) are adjacent in the acoustic wave propagation direction. That is, in a region including the first portion and the second portion, a pattern where the first electrode fingers and the second electrode fingers are alternately arranged appears at least twice. In other words, in a region including the first portion and the second portion, the first electrode fingers are periodically removed.

It is not necessary that the first and second electrode fingers are arranged in the same predetermined order over the entire IDT electrode. For example, in FIGS. 8A and 8B, the order of arrangement of the first and second electrode fingers in the parts A3 and A4 may differ from the order of arrangement of the first and second electrode fingers in the parts A1 and A2.

It is also not necessary that the first and second portions of the IDT electrode where the first and second electrode fingers are arranged in the same order are adjacent to each other. For example, between the first and second portions where the first and second electrode fingers are arranged in the same order, there may be one or more electrode fingers arranged in an undefined order.

7. Comparison of Characteristics of Quadplexers Including Filters According to Examples A bandpass characteristic and an isolation characteristic in the quadplexer 1 that includes, as the filter 12, one of filters according to Examples 1 and 2 (hereinafter simply referred to as Examples 1 and 2) will now be described.

Figure 9A:
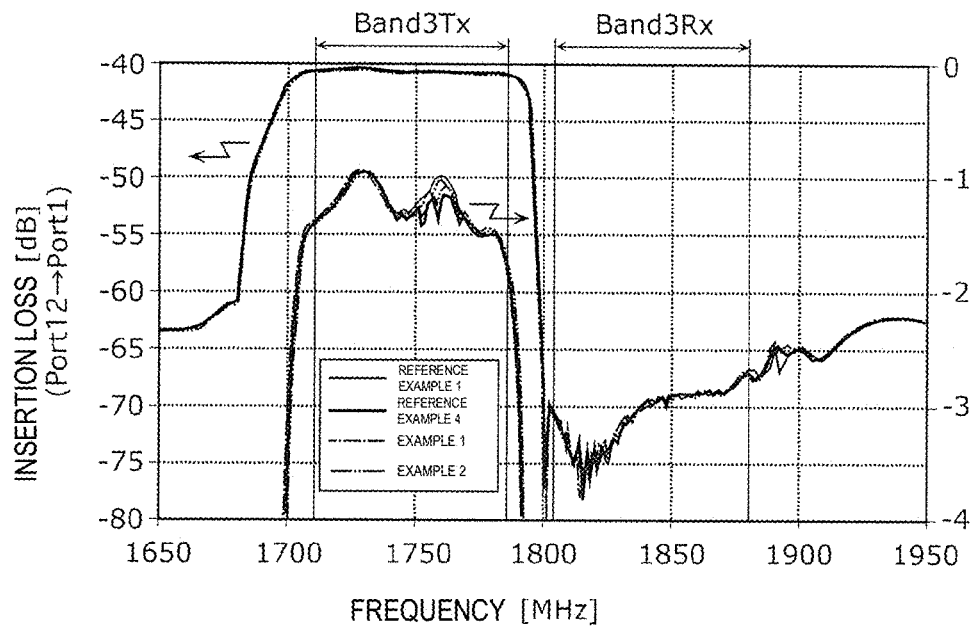
FIG. 9A is a graph that compares bandpass characteristics of quadplexers using filters according to Examples of preferred embodiments of the present invention to those of quadplexers using filters according to Reference Examples.

FIG. 9A is a graph that compares exemplary bandpass characteristics between the individual terminal Port 12 and the common terminal Port 1 in Examples 1 and 2 to those in Reference Examples 1 and 4. Specifically, FIG. 9A shows a bandpass characteristic of a path that passes through the filter 12 (filter for Band 3 Tx). More specifically, FIG. 9A shows insertion loss which is the ratio of the strength of a signal output from the common terminal Port 1 to the strength of a signal input to the individual terminal Port 12.

Figure 9B:
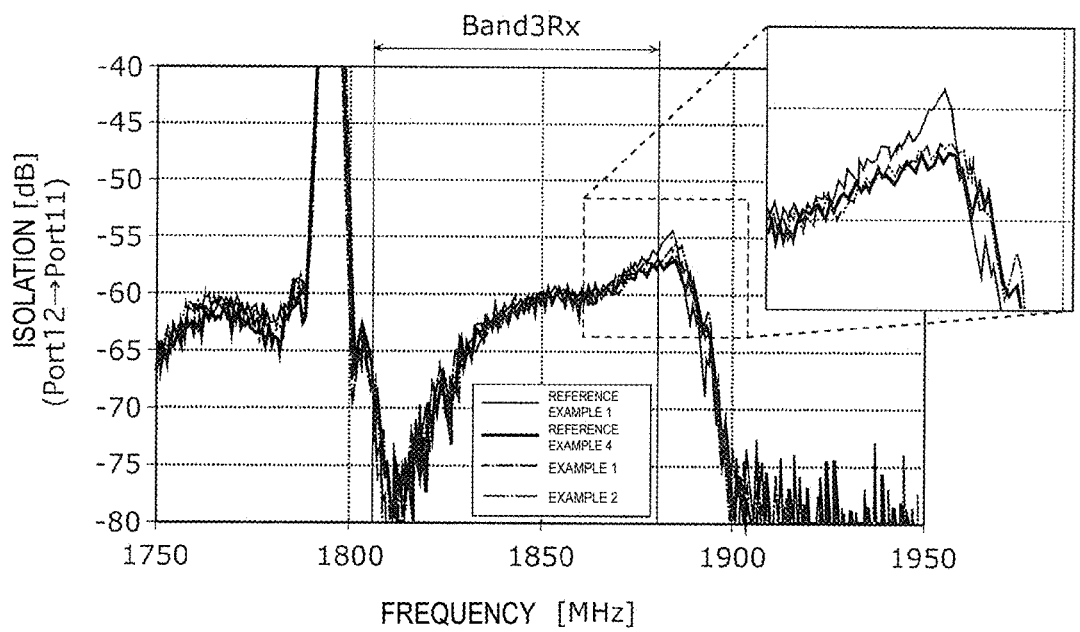
FIG. 9B is a graph that compares isolation characteristics of the quadplexers using filters according to Examples of preferred embodiments of the present invention to those of the quadplexers using filters according to Reference Examples.

FIG. 9B is a graph that compares exemplary isolation characteristics between the individual terminal Port 12 and the individual terminal Port 11 in Examples 1 and 2 to those in Reference Examples 1 and 4. Specifically, FIG. 9B shows an isolation characteristic of a path that passes through the filter 12 and the filter 11 (filter for Band 3 Rx). More specifically, FIG. 9B shows isolation which is the ratio of the strength of a signal output from the individual terminal Port 11 to the strength of a signal input to the individual terminal Port 12.

Figure 9C:
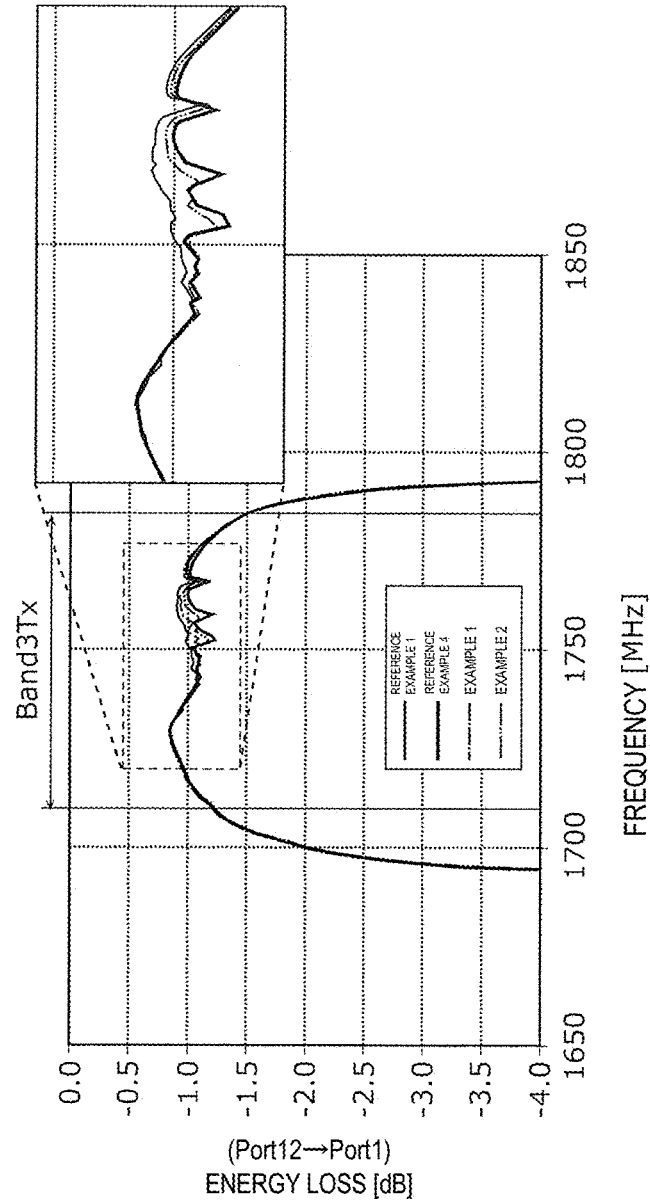
FIG. 9C is a graph that compares energy losses in the quadplexers using filters according to Examples of preferred embodiments of the present invention to those in the quadplexers using filters according to Reference Examples.

FIG. 9C is a graph that compares exemplary energy losses between the individual terminal Port 12 and the common terminal Port 1 in Examples 1 and 2 to those in Reference Examples 1 and 4. Specifically, FIG. 9C shows a bandpass characteristic of a path that passes through the filter 12 (filter for Band 3 Tx). More specifically, FIG. 9C shows power consumption in a path obtained by subtracting matching loss from insertion loss which is the ratio of the strength of a signal output from the common terminal Port 1 to the strength of a signal input to the individual terminal Port 12.

FIGS. 9A to 9C show that in Reference Example 1, a significant ripple occurs at the high end of Band 3 Rx band, and in Reference Example 4, insertion loss increases in Band 3 Tx band. The increase in insertion loss in Band 3 Tx band in Reference Example 4 is caused by the series resonators S1 and S3.

The ripple occurring in the isolation characteristic at the high end of Band 3 Rx band is most significant (or worst) in Reference Example 1, and gets smaller (or better) in Example 1, Example 2, and Reference Example 4 in this order. The level of ripple in Example 2 is the same or substantially the same as that in Reference Example 4. The insertion loss and the energy loss in Band 3 Tx band are both most significant (or worst) in Reference Example 4, and get smaller (or better) in Example 2, Example 1, and Reference Example 1 in this order.

Table 2 summarizes the results by using the ripple occurring in the isolation characteristic in Reference Example 4 and the insertion loss in Reference Example 1 as references for a ripple and insertion loss.

As summarized in Table 2, a ripple occurring in the isolation characteristic is significant in Reference Example 1, and insertion loss is significant in Reference Example 4. That is, neither of Reference Examples 1 and 4 can achieve good characteristics in both of isolation and insertion loss. In contrast to this, because of smaller ripples than in Reference Example 1 and smaller insertion losses than in Reference Example 4, Examples 1 and 2 can achieve good characteristics in both of isolation and insertion loss. Particularly in Example 2, the level of ripple can be reduced to substantially the same level as that in Reference Example 4.

TABLE 2

| Percentage of Variant Portions Removed | Resonator S4 | Resonator S3 | Resonator S2 | Resonator S1 | Ripple | Insertion Loss |
|---|---|---|---|---|---|---|
| Reference Example 1 | 0% | 0% | 0% | 0% | × | ⊚ |
| Reference Example 4 | 0% | 100% | 0% | 100% | ⊚ | × |
| Example 1 | 0% | 50% | 0% | 50% | ○ | ○ |
| Example 2 | 0% | 75% | 0% | 75% | ⊚ | ○ |

The results show that when, in one or more of a plurality of series resonators included in a filter, first and second electrode fingers are arranged in the same predetermined order in the first and second portions of an IDT electrode, a filter with a small ripple and small insertion loss can be obtained.

The series resonator where the first and second electrode fingers are to be arranged in the same predetermined order in the first and second portions of the IDT electrode, may be a series resonator other than the series resonator having the lowest anti-resonant frequency (i.e., resonator providing steepness at a pass band edge of the filter) of the plurality of series resonators included in the filter. Thus, a filter with good characteristics in both of ripple in the vicinity of the anti-resonant frequency and insertion loss can be obtained, without sacrificing steepness of the bandpass characteristic of the filter.

8. Configuration of Filter According to Modification

The first preferred embodiment has described, as an example, the configuration of the first filter (filter 12 in the first preferred embodiment) having only a ladder filter structure. Alternatively, the first filter may have a longitudinally coupled filter structure, in addition to the ladder filter structure. Accordingly, the present modification will describe a quadplexer that includes a first filter having such a filter structure. All of the plurality of filters of the quadplexer, except the first filter, have the same or substantially the same configuration as in the first preferred embodiment and thus their description will be omitted.

Figure 10:
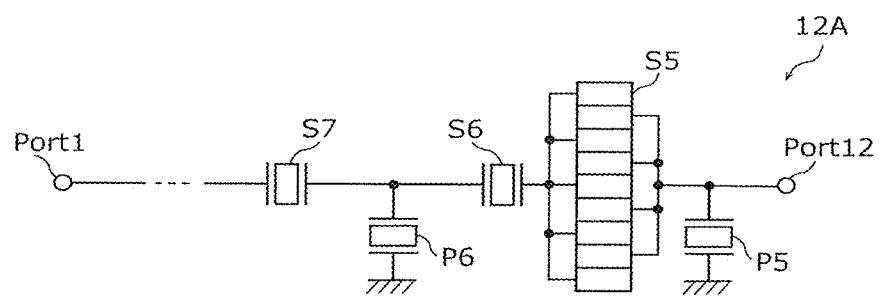
FIG. 10 is a diagram illustrating a circuit configuration of a filter according to a modification of the first preferred embodiment of the present invention.

FIG. 10 is a diagram illustrating a circuit configuration of a filter 12A (first filter) according to a modification of the first preferred embodiment of the present invention.

As illustrated in FIG. 10, the filter 12A includes series resonators S6 and S7, parallel resonators P5 and P6, and a longitudinally coupled resonator S5. That is, the filter 12A is a filter obtained by including the longitudinally coupled resonator S5 to a ladder filter structure.

The longitudinally coupled resonator S5 has a longitudinally coupled filter structure disposed between the common terminal Port 1 and the individual terminal Port 12. In the present preferred embodiment, the longitudinally coupled resonator S5 is disposed on one side of the series resonator S6 adjacent to the individual terminal Port 12, and includes nine IDTs and reflectors disposed at their both ends. The position at which the longitudinally coupled resonator S5 is disposed is not limited to this. For example, the longitudinally coupled resonator S5 may be disposed between the series resonator S7 and the series resonator S6, or may be disposed on one side of the series resonator S7 adjacent to the common terminal Port 1.

With the quadplexer including the first filter (filter 12A in the present modification) configured as described above, when, as in the first preferred embodiment, first and second electrode fingers are arranged in the same predetermined order in the first and second portions of the IDT electrode included in at least one of the series resonators S6 and S7, a good filter in terms of both a ripple in the vicinity of the anti-resonant frequency and insertion loss can be obtained.

The series resonator where the first and second electrode fingers are to be arranged in the same predetermined order in the first and second portions of the IDT electrode, may be a series resonator other than the series resonator having the lowest anti-resonant frequency (i.e., resonator defining a pass band edge of the filter) of the series resonators S6 and S7. Thus, a good filter in terms of both a ripple in the vicinity of the anti-resonant frequency and insertion loss can be obtained, without sacrificing steepness of the bandpass characteristic of the filter.

With the longitudinally coupled filter structure described above, the filter 12A according to the present preferred embodiment can be adapted to a required filter characteristic, such as improved attenuation.

Second Preferred Embodiment

The quadplexers according to the first preferred embodiment and its modification are applicable to a radio frequency front-end circuit and to a communication device including the radio frequency front-end circuit. Accordingly, the present preferred embodiment will describe such a radio frequency front-end circuit and a communication device.

Figure 11:
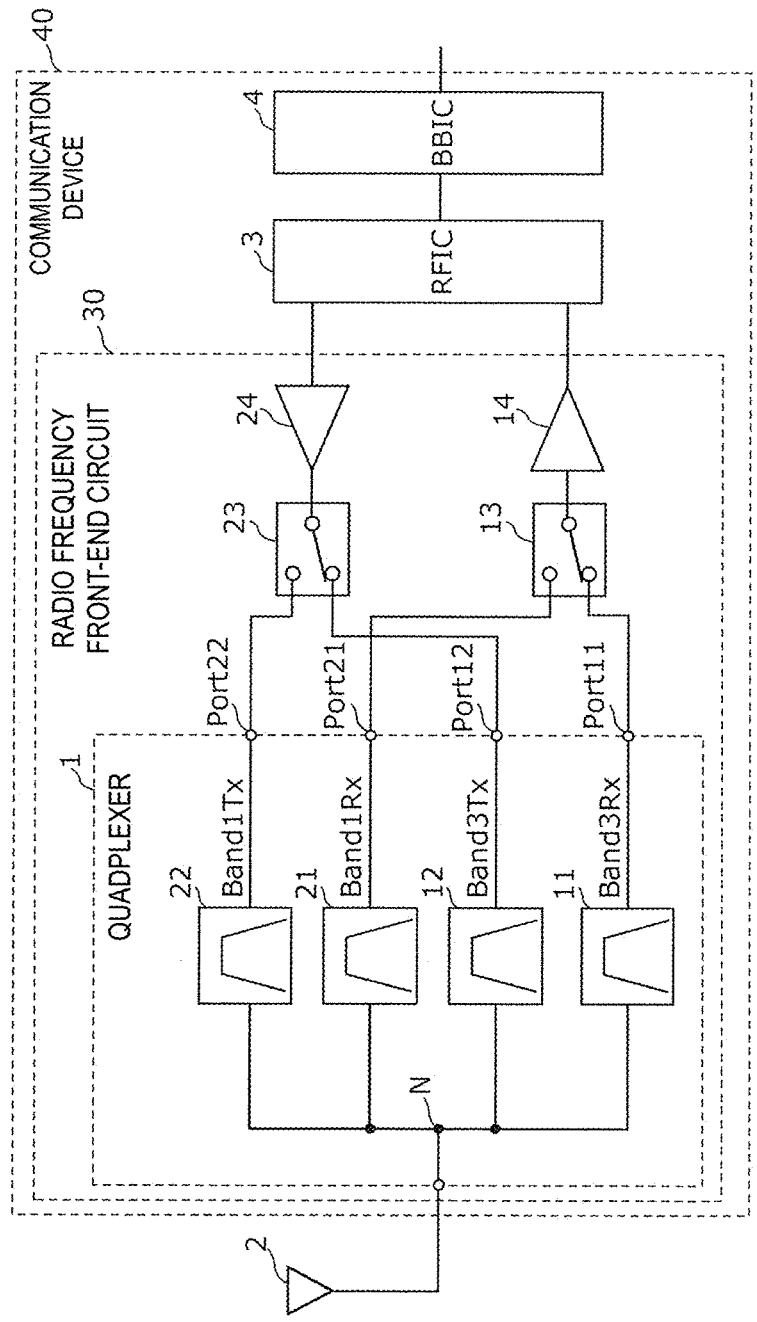
FIG. 11 is a diagram illustrating a configuration of a radio frequency front-end circuit according to a second preferred embodiment of the present invention.

FIG. 11 is a diagram illustrating a configuration of a radio frequency front-end circuit 30 according to a second preferred embodiment of the present invention. FIG. 11 also illustrates components (for example, antenna element 2, RF signal processing circuit (RFIC) 3, and baseband signal processing circuit (BBIC) 4) connected to the radio frequency front-end circuit 30. The radio frequency front-end circuit 30, the RF signal processing circuit 3, and the baseband signal processing circuit 4 define a communication device 40.

The radio frequency front-end circuit 30 includes the quadplexer 1 according to the first preferred embodiment, a receiving-side switch 13, a transmitting-side switch 23, a low-noise amplifier circuit 14, and a power amplifier circuit 24.

The receiving-side switch 13 is a switch circuit that includes two selection terminals individually connected to the respective individual terminals Port 11 and Port 21, which are receiving terminals of the quadplexer 1, and a common terminal connected to the low-noise amplifier circuit 14.

The transmitting-side switch 23 is a switch circuit that includes two selection terminals individually connected to the respective individual terminals Port 12 and Port 22, which are transmitting terminals of the quadplexer 1, and a common terminal connected to the power amplifier circuit 24.

The receiving-side switch 13 and the transmitting-side switch 23 are each configured to connect the common terminal to a signal path corresponding to a predetermined band in accordance with a control signal from a controller (not shown) and are, for example, a single pole, double throw (SPDT) switch. Only one selection terminal is connected to the common terminal here, but more than one selection terminal may be connected to the common terminal. That is, the radio frequency front-end circuit 30 may support carrier aggregation.

The low-noise amplifier circuit 14 is a reception amplifying circuit that amplifies a radio frequency signal (or radio frequency reception signal here) passing through the antenna element 2, the quadplexer 1, and the receiving-side switch 13, and outputs the amplified radio frequency signal to the RF signal processing circuit 3.

The power amplifier circuit 24 is a transmission amplifying circuit that amplifies a radio frequency signal (or radio frequency transmission signal here) output from the RF signal processing circuit 3, and outputs the amplified radio frequency signal to the antenna element 2 through the transmitting-side switch 23 and the quadplexer 1.

The RF signal processing circuit 3 applies signal processing, such as down-conversion, for example, to a radio frequency reception signal received from the antenna element 2 through a reception signal path, and outputs a reception signal generated by the signal processing to the baseband signal processing circuit 4. Also, the RF signal processing circuit 3 applies signal processing, such as up-conversion, for example, to a transmission signal received from the baseband signal processing circuit 4, and outputs a radio frequency transmission signal generated by the signal processing to the power amplifier circuit 24. The RF signal processing circuit 3 is, for example, an RFIC.

A signal processed by the baseband signal processing circuit 4 defines and functions, for example, as an image signal for image display, or as an audio signal for phone calls.

The radio frequency front-end circuit 30 may include other circuit elements between the components described above.

With the quadplexer 1 according to the first preferred embodiment of the present invention, the radio frequency front-end circuit 30 and the communication device 40 configured as described above can achieve good characteristics in terms of both a ripple occurring in the isolation characteristic and passing loss.

The radio frequency front-end circuit 30 may include the quadplexer according to the modification of the first preferred embodiment, instead of the quadplexer 1 according to the first preferred embodiment.

Depending on the method used to process radio frequency signals, the communication device 40 does not necessarily need to include the baseband signal processing circuit (BBIC) 4.

Other Preferred Embodiments

The filters, multiplexers, radio frequency front-end circuits, and communication devices according to preferred embodiments of the present invention have been described with reference to preferred embodiments and their modifications. The present invention also includes other preferred embodiments obtained by combining any of the components described in the preferred embodiments and modifications described above, other modifications obtained by making various changes conceived by those skilled in the art to the aforementioned preferred embodiments without departing from the scope of the present invention, and various apparatuses including the radio frequency front-end circuits and the communication devices according to preferred embodiments of the present invention.

For example, although the description above has described a quadplexer as an example of the multiplexer, the present invention is also applicable, for example, to a triplexer where three filters share a common antenna terminal and to a hexaplexer where six filters share a common antenna terminal. That is, it is only necessary that the multiplexer includes two or more filters.

The multiplexer does not necessarily need to be configured to include both a transmitting filter and a receiving filter, and may be configured to include a transmitting filter alone or a receiving filter alone.

In the first preferred embodiment, the filter 12 and the filter 11 have been described as corresponding to the first filter and the second filter, respectively. That is, in the first preferred embodiment, the first filter and the second filter are a transmitting filter and a receiving filter, respectively. However, for example, regardless of the usage of the first and second filters, preferred embodiments of the present invention are applicable to any multiplexer in which a stop band ripple of the first filter is located within the pass band of the second filter. This, both the first filter and the second filter may be transmitting filters.

As described above, a filter according to a preferred embodiment of the present invention includes a pair of input and output terminals, and one or more series resonators in a signal path connecting the input and output terminals. The one or more series resonators each include an IDT electrode including a pair of comb-teeth electrodes on a substrate including a piezoelectric layer. Each of the comb-teeth electrodes included in each of the one or more series resonators includes a plurality of electrode fingers disposed to extend in a direction orthogonal or substantially orthogonal to an acoustic wave propagation direction, and a busbar electrode connecting respective first ends of the plurality of electrode fingers. The IDT electrode included in each of the one or more series resonators includes at least either first electrode fingers whose electrode finger width at second ends of the plurality of electrode fingers is greater than an electrode finger width at middle portions, or second electrode fingers whose electrode finger width at the second ends is less than or equal to an electrode finger width at middle portions. The one or more series resonators include one or more first series resonators. In the IDT electrode of each of the one or more first series resonators, a direction connecting the respective second ends of the plurality of electrode fingers intersects the acoustic wave propagation direction. The IDT electrode of each of the one or more first series resonators includes a first portion and a second portion. The first electrode fingers and the second electrode fingers are arranged in a predetermined order in the first portion of the IDT electrode, and the first electrode fingers and the second electrode fingers are arranged in the predetermined order in the second portion of the IDT electrode.

The first portion and the second portion may be adjacent in the acoustic wave propagation direction.

The first portion and the second portion may be repeated over the entire IDT electrode forming each of the one or more first series resonators.

Thus, in the IDT electrode of each first series resonator of the filter, the first electrode fingers (variant fingers) and the second electrode fingers (electrode fingers not having variant portions) are disposed in a mixed arrangement. This enables a reduction of both a ripple which tends to increase in the vicinity of an anti-resonant frequency when all of the electrode fingers are first electrode fingers, and a ripple which tends to increase in the vicinity of a resonant frequency when all of the electrode fingers are second electrode fingers. A filter can thus be obtained, which is capable of reducing both a ripple in the vicinity of a resonant frequency and a ripple in the vicinity of an anti-resonant frequency.

The one or more series resonators may further include one or more second series resonators disposed in the signal path connecting the input and output terminals. The IDT electrode of each of the one or more second series resonators may be the first electrode fingers.

Each of the one or more first series resonators may be a series resonator other than a series resonator having the lowest anti-resonant frequency of the one or more series resonators.

Thus, the first electrode fingers and the second electrode fingers are mixed in each series resonator other than the series resonator having the lowest anti-resonant frequency, that is, other than the series resonator providing steepness at a pass band edge of the filter. A filter with good characteristics in both a ripple in the vicinity of the anti-resonant frequency and insertion loss can thus be obtained, without sacrificing steepness of the bandpass characteristic of the filter.

The filter may further include one or more parallel resonators disposed in a path connecting the signal path to a ground, and may have a ladder filter structure.

This enables the filter to be adapted to a required filter characteristic, such as low loss, for example.

The filter may have a longitudinally coupled filter structure disposed in the signal path.

This enables the filter to be adapted to a required filter characteristic, such as improved attenuation, for example.

The substrate may include the piezoelectric layer with the IDT electrode provided on one principal surface thereof, a high-acoustic-velocity supporting substrate enabling a bulk wave to propagate therein at an acoustic velocity higher than an acoustic velocity of an acoustic wave propagating in the piezoelectric layer, and a low-acoustic-velocity film disposed between the high-acoustic-velocity supporting substrate and the piezoelectric layer and enabling a bulk wave to propagate therein at an acoustic velocity lower than an bulk velocity of an acoustic wave propagating in the piezoelectric layer.

This makes it possible to maintain, at a high level, the Q-factor of each resonator that includes the IDT electrode on the substrate including the piezoelectric layer.

A multiplexer according to a preferred embodiment of the present invention includes a common terminal, a first terminal, and a second terminal; a first filter in a first path connecting the common terminal to the first terminal; and a second filter in a second path connecting the common terminal to the second terminal, and having a pass band of frequencies higher than a pass band of the first filter. The first filter is the filter described above.

A multiplexer can thus be obtained, which has good characteristics in both insertion loss in the second path and isolation between the first terminal and the second terminal.

The pass band of the first filter may be, for example, an uplink frequency band in Band 3 of the Long-Term Evolution (LTE), and the pass band of the second filter may be an downlink frequency band in Band 3 of the LTE.

When the pass band of the first filter is an uplink frequency band in Band 3 of the LTE, and the pass band of the second filter is an downlink frequency band in Band 3 of the LTE, a ripple in the pass band of the second filter tends to increase. Therefore, when the series resonator of the first filter closest to the common terminal is configured to have the conditions described above, the increase of ripple can be effectively reduced.

A radio frequency front-end circuit according to a preferred embodiment of the present invention includes any of the multiplexers described above, and an amplifying circuit connected to the multiplexer.

A radio frequency front-end circuit capable of reducing a ripple in the pass band can thus be provided.

A communication device according to a preferred embodiment of the present invention includes an RF signal processing circuit configured to process a radio frequency signal transmitted and received by an antenna element, and the radio frequency front-end circuit configured to transmit the radio frequency signal between the antenna element and the RF signal processing circuit.

A communication device capable of reducing a ripple in the pass band can thus be provided.

As filters, multiplexers, front-end circuits, and communication devices that are applicable to multiband systems, preferred embodiments of the present invention can be widely used for communication apparatuses, such as mobile phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
   a pair of input and output terminals; and
   one or more series resonators along a signal path connecting the input and output terminals; wherein
   the one or more series resonators each include an IDT electrode including a pair of comb-teeth electrodes on a substrate including a piezoelectric layer;
   each of the comb-teeth electrodes included in each of the one or more series resonators includes:
      a plurality of electrode fingers extending in a direction orthogonal or substantially orthogonal to an acoustic wave propagation direction; and
      a busbar electrode connecting respective first ends of the plurality of electrode fingers;
   the IDT electrode included in each of the one or more series resonators includes at least either first electrode fingers having electrode finger widths at second ends of the plurality of electrode fingers greater than electrode finger widths at middle portions thereof, or second electrode fingers having electrode finger widths at second ends less than or equal to electrode finger widths at middle portions;
   the one or more series resonators include one or more first series resonators;
   in the IDT electrode of each of the one or more first series resonators, a direction connecting the respective other ends of the plurality of electrode fingers intersects the acoustic wave propagation direction; and
   the IDT electrode of each of the one or more first series resonators includes a first portion and a second portion, the first electrode fingers and the second electrode fingers are arranged in a predetermined order in the first portion of the IDT electrode, and the first electrode fingers and the second electrode fingers are arranged in the predetermined order in the second portion of the IDT electrode.

2. The filter according to claim 1, wherein the first portion and the second portion are adjacent in the acoustic wave propagation direction.

3. The filter according to claim 2, wherein the first portion and the second portion are repeated over an entirety of the IDT electrode of each of the one or more first series resonators.

4. The filter according to claim 1, wherein
   the one or more series resonators further include one or more second series resonators in the signal path connecting the input and output terminals; and
   the IDT electrode of each of the one or more second series resonators is defined by the first electrode fingers.

5. The filter according to claim 4, wherein each of the one or more first series resonators is a series resonator other than a series resonator having a lowest anti-resonant frequency of the one or more series resonators.

6. The filter according to claim 1, further comprising:
   one or more parallel resonators in a path connecting the signal path to a ground; wherein
   the filter has a ladder filter structure.

7. The filter according to claim 1, wherein the filter has a longitudinally coupled filter structure disposed in the signal path.

8. The filter according to claim 1, wherein the substrate includes:
   the piezoelectric layer with the IDT electrode on one principal surface thereof;
   a high-acoustic-velocity supporting substrate enabling a bulk wave to propagate therein at an acoustic velocity higher than an acoustic velocity of an acoustic wave propagating in the piezoelectric layer; and
   a low-acoustic-velocity film between the high-acoustic-velocity supporting substrate and the piezoelectric layer, the low-acoustic-velocity film enabling a bulk wave to propagate therein at an acoustic velocity lower than an acoustic velocity of a bulk wave propagating in the piezoelectric layer.

9. A multiplexer comprising:
   a common terminal, a first terminal, and a second terminal;
   a first filter in a first path connecting the common terminal to the first terminal; and
   a second filter in a second path connecting the common terminal to the second terminal, the second filter having a pass band of frequencies higher than a pass band of the first filter;
   wherein
   the first filter is the filter according to claim 1.

10. The multiplexer according to claim 9, wherein
    the pass band of the first filter is an uplink frequency band in Band 3 of the Long-Term Evolution (LTE); and
    the pass band of the second filter is a downlink frequency band in Band 3 of the LTE.

11. A radio frequency front-end circuit comprising:
    the multiplexer according to claim 9; and
    an amplifying circuit connected to the multiplexer.

12. A communication device comprising:
    an RF signal processing circuit to process a radio frequency signal transmitted and received by an antenna element; and
    the radio frequency front-end circuit according to claim 11; wherein
    the radio frequency front-end circuit capable of transmitting the radio frequency signal between the antenna element and the RF signal processing circuit.

13. The multiplexer according to claim 9, wherein the first portion and the second portion are adjacent in the acoustic wave propagation direction.

14. The multiplexer according to claim 13, wherein the first portion and the second portion are repeated over an entirety of the IDT electrode of each of the one or more first series resonators.

15. The multiplexer according to claim 9, wherein
    the one or more series resonators further include one or more second series resonators in the signal path connecting the input and output terminals; and
    the IDT electrode of each of the one or more second series resonators is defined by the first electrode fingers.

16. The multiplexer according to claim 15, wherein each of the one or more first series resonators is a series resonator other than a series resonator having a lowest anti-resonant frequency of the one or more series resonators.

17. The multiplexer according to claim 9, further comprising:
    one or more parallel resonators in a path connecting the signal path to a ground; wherein
    the filter has a ladder filter structure.

18. The multiplexer according to claim 9, wherein the filter includes a longitudinally coupled filter structure along the signal path.

19. The multiplexer according to claim 9, wherein the substrate includes:
    the piezoelectric layer with the IDT electrode on one principal surface thereof;

a high-acoustic-velocity supporting substrate enabling a bulk wave to propagate therein at an acoustic velocity higher than an acoustic velocity of an acoustic wave propagating in the piezoelectric layer; and
a low-acoustic-velocity film between the high-acoustic-velocity supporting substrate and the piezoelectric layer, the low-acoustic-velocity film enabling a bulk wave to propagate therein at an acoustic velocity lower than an acoustic velocity of a bulk wave propagating in the piezoelectric layer.

* * * * *